US008947931B1

(12) United States Patent
D'Abreu

(10) Patent No.: US 8,947,931 B1
(45) Date of Patent: Feb. 3, 2015

(54) MEMORY MODULE

(71) Applicant: Sandisk Technologies Inc., Plano, TX (US)

(72) Inventor: Manuel Antonio D'Abreu, El Dorado Hills, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 14/304,613

(22) Filed: Jun. 13, 2014

(51) Int. Cl.
*G11C 16/04* (2006.01)
*H01L 27/115* (2006.01)
*G11C 5/06* (2006.01)

(52) U.S. Cl.
CPC .... *H01L 27/11551* (2013.01); *H01L 27/11578* (2013.01); *G11C 16/0483* (2013.01); *G11C 5/06* (2013.01)
USPC .................................. 365/185.05; 365/185.11

(58) Field of Classification Search
USPC ............. 365/185.05, 185.11, 230.03, 230.06; 257/314, 324
See application file for complete search history.

(56) References Cited

U.S. PATENT DOCUMENTS

2010/0269021 A1* 10/2010 Gower et al. .................. 714/764
2011/0115010 A1* 5/2011 Shim et al. .................... 257/314
2012/0250433 A1 10/2012 Jeon

OTHER PUBLICATIONS

Shah, Agam "Samsung's New 1TB SSD is Based on Latest 3D Technology," IT World, http://www.itworld.com/print/420770, May 28, 2014, 1 page.
Loi, Igor et al. "An Efficient Distributed Memory Interface for Many-Core Platform with 3D Stacked DRAM," IEEE, Design, Automation & Test in Europe Conference & Exhibition, Dresden, Germany, Mar. 8-12, 2010, 6 pages.

* cited by examiner

*Primary Examiner* — Vu Le
(74) *Attorney, Agent, or Firm* — Toler Law Group, PC

(57) ABSTRACT

A data storage device includes a memory die including a plurality of storage elements arranged in a three dimensional (3D) memory configuration and a controller die coupled to the memory die via a bus including a plurality of electrical contacts between adjacent surfaces of the memory die and the controller die. A method performed at the data storage device includes receiving, at the controller die, data to be stored at the memory die and generating a codeword representing the data. The codeword includes a particular number of bits. The method also includes sending signals from the controller die to the memory die via the plurality of electrical contacts. The plurality of electrical contacts includes at least as many electrical contacts as the particular number of bits of the codeword, and the signals representing the codeword are sent from the controller die to the memory die in parallel.

20 Claims, 6 Drawing Sheets

MEMORY MODULE

FIELD OF THE DISCLOSURE

The present disclosure is generally related to a memory module.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

As storage capacity of memory modules increases, data communications within a data storage device can significantly decrease performance of the data storage device. For example, a high capacity memory module (e.g., a memory module that includes one or more high capacity memory arrays) may store large quantities of data. Reading the data from a memory array and writing the data to a memory array generally involves communicating the data from a memory controller to the memory array. Each such data communication is associated with latency, which can decrease overall performance of the memory module or of a data storage device that includes the memory module.

SUMMARY

Data throughput of communications between a memory and a controller may be improved using flip chip and bump technology. For example, a controller die and a memory die may be coupled together using flip chip bump technology to form a chip stack. The memory die may include a plurality of electrical contacts coupled to the controller die. The controller die may be configured to store data in the memory die as a codeword representing the data. The codeword has a particular number of bits. The electrical contacts of the memory die may include at least as many electrical contacts as the number of bits of the codeword. Accordingly, an entire codeword may be communicated from the controller die to the memory die or from the memory die to the controller die in parallel (e.g., in a single clock cycle).

For example, when memory control circuitry of the controller die is configured to generate a 512 bit codeword, the electrical contacts between the memory die and the controller die may include at least 512 electrical contacts forming a bus (e.g., a bus formed by a plurality of through silicon vias (TSVs)). Each electrical contact of the bus may be used to transmit one bit from the controller die to the memory die or from the memory die to the controller die. Accordingly, a fully parallel transmission of all bits of the codeword may be accomplished during a single clock cycle of a processor of a host device or a single clock cycle of a processor of the controller die.

For memory technologies having a high storage density, such as three-dimensional (3D) memories, reduced data transfer latency enabled by the fully parallel transmission between dies may significantly improve memory device performance. In addition, multiple stacks of such dies may be arranged on a common substrate that includes interconnects to further enable increased storage capacity and/or data throughput.

DETAILED DESCRIPTION

Particular embodiments of the present disclosure are described with reference to the drawings. In the description, common features are designated by common reference numbers throughout the drawings.

Figure 1:
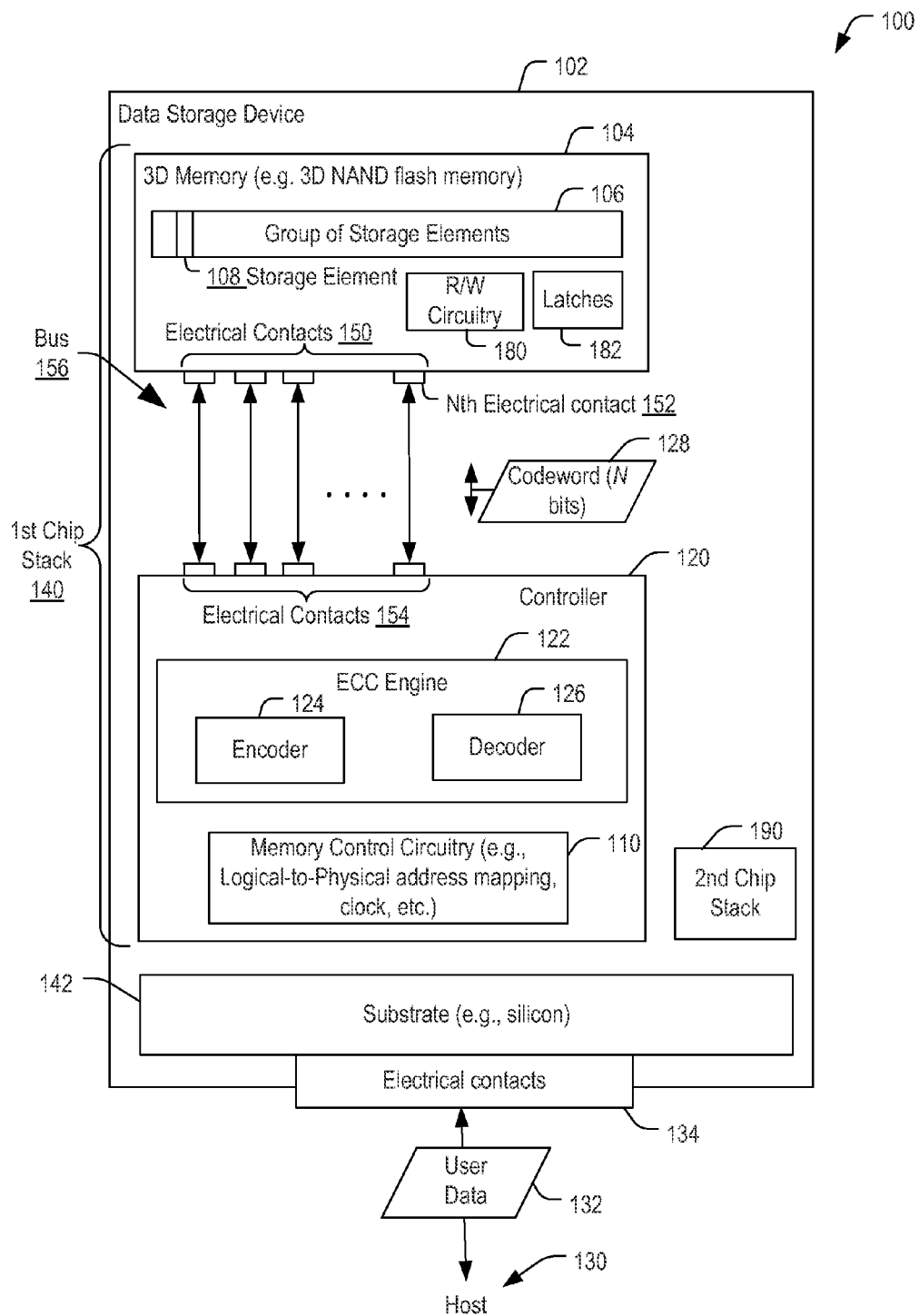
FIG. 1 is a block diagram of a particular illustrative embodiment of a system including a data storage device configured to communicate data between a controller and a memory.

FIG. 1 illustrates a particular embodiment of a system 100 that includes a data storage device 102 coupled to a host device 130. The data storage device 102 includes a memory 104.

The host device 130 may be configured to provide data, such as the user data 132, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The memory 104 may be a non-volatile memory, such as a NAND flash memory or a resistive random access memory (ReRAM). The memory 104 may be a 3D memory, and examples of 3D NAND and ReRAM architectures are described with reference to FIGS. 5 and 6, respectively. The memory 104 includes a representative group 106 of storage elements, such as a word line of a multi-level cell (MLC) flash memory. The group 106 includes a representative storage element 108. The group 106 of storage elements may be arranged in a three dimensional (3D) memory configuration (e.g., a 3D array of storage elements).

The data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 also includes circuitry associated with operation of the storage elements, such as read/write circuitry 180 and/or one or more latches 182. The latches 182 are configured to store data read from storage elements of the memory 104 or to be written to storage elements. The read/write circuitry 180 is configured to control reading of data from storage elements of the memory 104 to the latches 182 or writing of data from the latches 182 into storage elements of the memory 104.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store the data to a specified address. As another example, the controller 120 is configured to send a read command to read data from a specified address of the memory 104.

The controller 120 includes an ECC engine 122 that is configured to receive data to be stored to the memory 104 and to generate a codeword 128. For example, the ECC engine 122 may include an encoder 124 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 122 may include a decoder 126 configured to decode data read from the memory 104 to detect and correct, up to an error correction capability of the ECC scheme, bit errors that may be present in the data.

In a particular embodiment, the memory 104 includes or corresponds to a memory die or multiple memory dies, and the controller 120 includes or corresponds to a memory controller die. In this embodiment, the memory die includes a plurality of electrical contacts 150, and the controller die includes a corresponding plurality of electric contacts 154 coupled to the plurality of electrical contacts 150 of the memory die to form at least a portion of a bus 156.

The codeword 128 has a particular number of bits (N bits) based on the ECC encoding scheme of the ECC engine 122. In a particular embodiment, each of the plurality of the electrical contacts 150 and the plurality of the electrical contacts 154 includes at least as many electrical contacts as the number of bits of the codeword 128. For example, when the codeword 128 includes N bits, the plurality of the electrical contacts 150 includes at least N electrical contacts (including, for example, a first contact to an Nth electrical contact 152). Additionally, the plurality of the electrical contacts 154 may include at least N electrical contacts. Thus, the bus 156 enables concurrent (i.e., parallel) communication of every bit of the codeword 128 between the memory 104 and the controller 120.

The controller 120 may also include memory control circuitry 110 such as logical-to-physical address mapping circuitry, a clock circuit, etc. The memory control circuitry 110 may facilitate receiving the user data 132 from the host device 130 and providing the codeword 128 to the memory 104. In a particular embodiment, the memory 104 and the controller 120 are arranged in a chip stack, such as a first chip stack 140. The data storage device 102 may also include one or more additional chip stacks, such as a second chip stack 190. The one or more additional chip stacks may include additional memory die, additional controller die, or both. For example, the second chip stack 190 may include a second controller die and a second memory die, as described with references to FIGS. 2 and 3. The first chip stack 140 and the second chip stack 190 may be coupled to a substrate 142, such as a silicon substrate. The substrate 142 may include a plurality of electrical contacts 134. For example, the plurality of electrical contacts 134 may be on a first side of the substrate 142, and the first chip stack 140 and the second chip stack 190 may be on a second side of the substrate 142 opposite of the first side.

Figure 2:
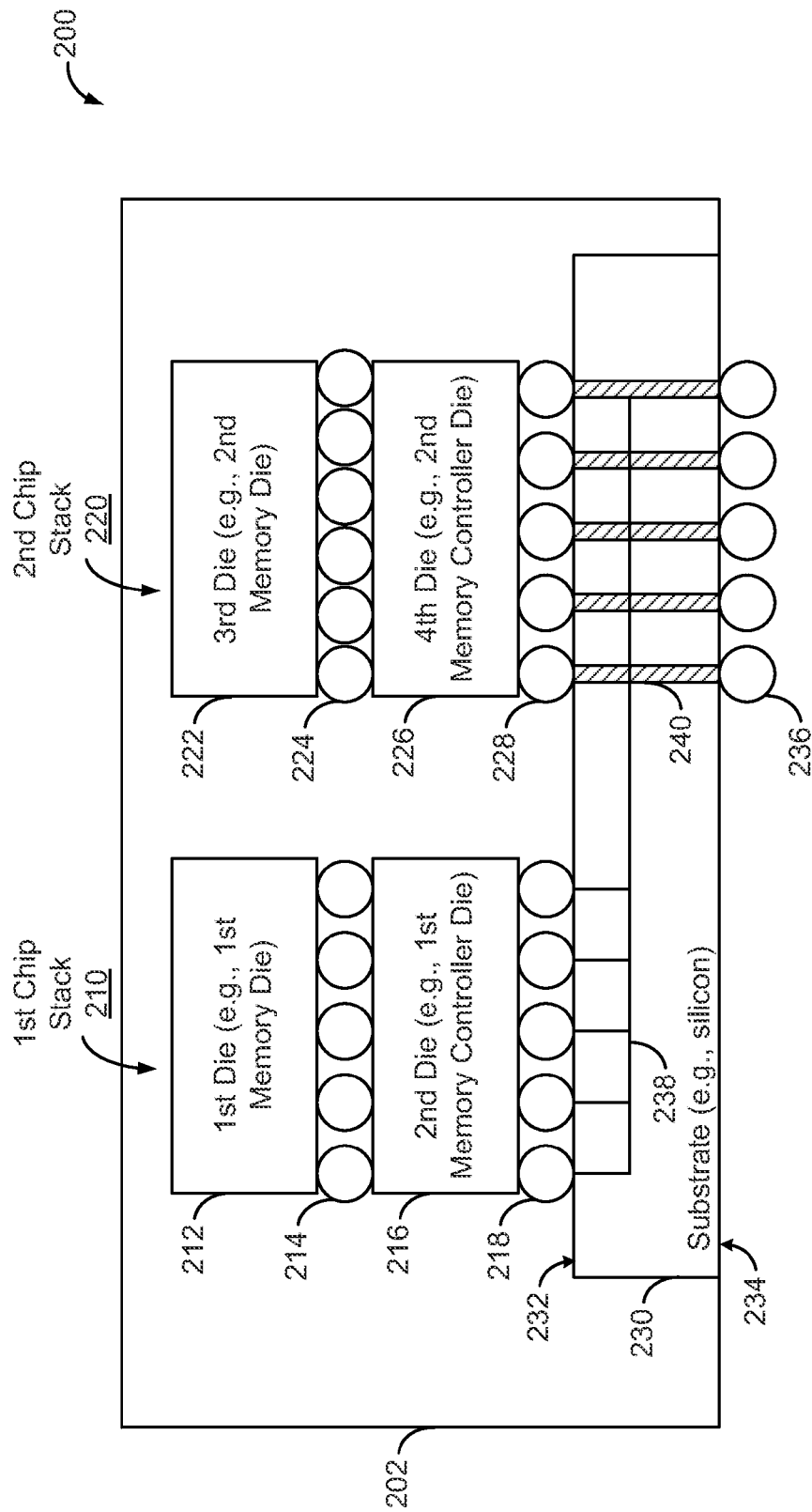
FIG. 2 is a block diagram illustrating a first particular embodiment of a memory module that may be incorporated in the data storage device of FIG. 1.
Figure 3:
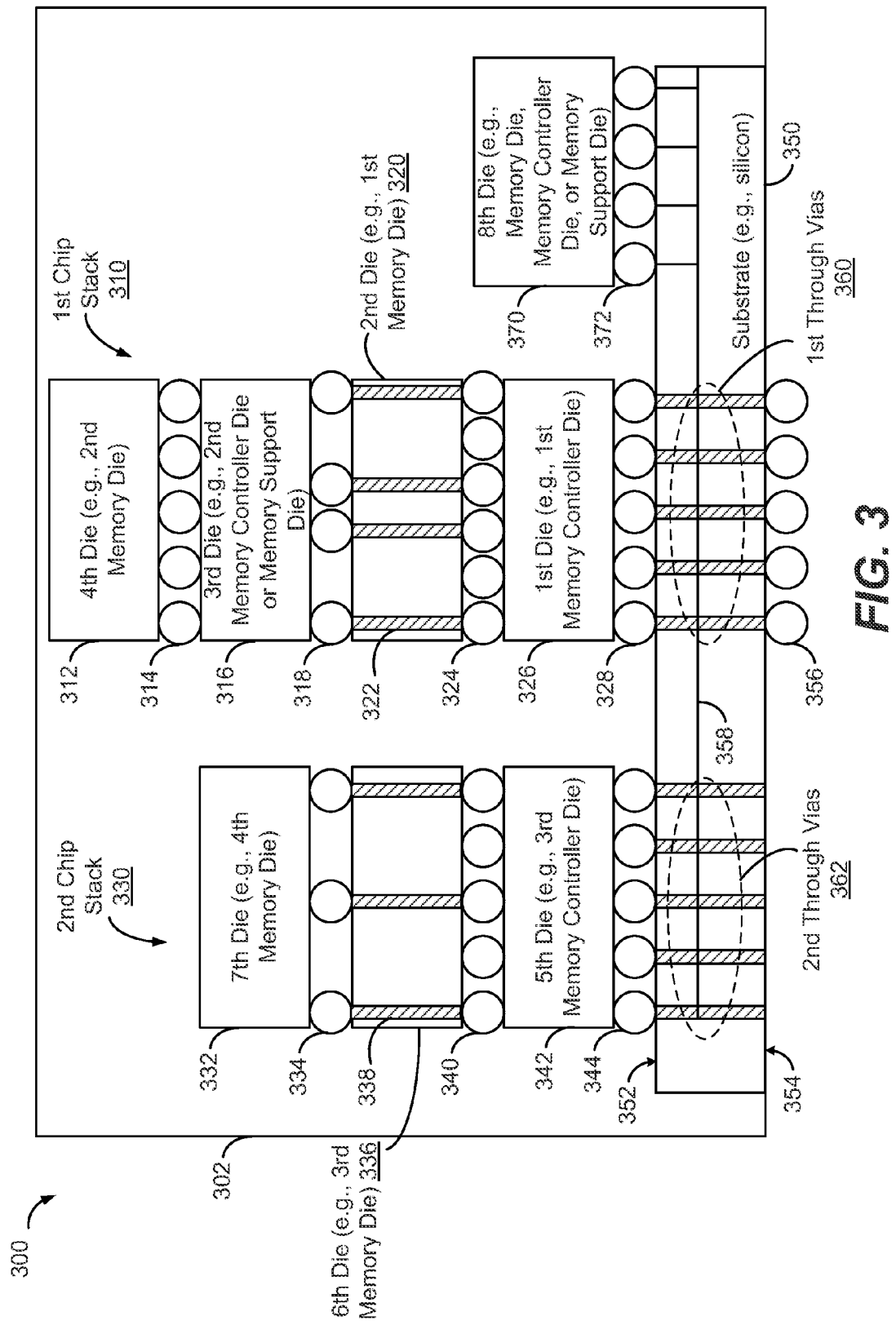
FIG. 3 is a block diagram illustrating a first particular embodiment of a memory module that may be incorporated in the data storage device of FIG. 1.

The electrical contacts 134 may be coupled to the first chip stack 140, the second chip stack 190, or both, by way of one or more through vias (e.g., through silicon vias (TSVS)), as described further with reference to FIGS. 2 and 3. Additionally, the substrate 142 may include interconnect circuitry coupling the first chip stack 140 to the one or more additional chip stacks (e.g., the second chip stack 190).

During operation, the user data 132 may be received from the host device 130 at the data storage device 102 as signals applied to the electrical contacts 134. The memory control circuitry 110 may process the user data 132. For example, the memory control circuitry 110 may determine whether the user data 132 corresponds to a read command or a write command. Additionally, the memory control circuitry 110 may detect a logical address indicated by the user data 132 and may map the logical address to a physical address of the memory 104. When the memory 104 includes multiple memory die, the physical address may correspond to a particular memory die and a particular group of storage elements. For example, the physical address may include chip selection information as well as information indicating a particular group of storage elements (e.g., row selection information and column selection information).

The memory control circuitry 110 may also provide the user data 132 (or a portion thereof) to the ECC engine 122 to generate the codeword 128. After the ECC engine 122 generates the codeword 128, the codeword 128 may be sent to the memory 104 (along with or in addition to information indicating the physical address). The codeword 128 may be sent from the controller 120 to the memory 104 by applying signals corresponding to the codeword 128 to the bus 156 (e.g., to the plurality of electrical contacts 154). In a particular embodiment, the signals corresponding to each bit of the codeword 128 (e.g., 512 signals when the codeword 128 includes 512 bits) are applied to the bus 156 in parallel. For example, all of the signals corresponding to the bits of the codeword 128 may be applied during a single clock cycle of a clock of the memory control circuitry 110. Alternately, if the data storage device 102 receives a clock signal from the host device 130, all of the signals corresponding to the bits of the codeword 128 may be applied to during a single clock cycle of a processor of the host device 130.

Thus, the data storage device 102 provides increased data throughput and communications from the controller 120 to the memory 104 by using bump technology and chip stacks, and by using a plurality of electrical contacts including at least as many electrical contacts as a number of bits in the codeword 128. As a result, overall performance of the data storage device 102 may be improved since latency associated with data communications between the memory 104 and the controller 120 may be reduced. Storage capacity may be improved by use of the multiple stacks as compared to a single-stack implementation. In addition, by supporting parallel data read and write operations at the multiple stacks, high data throughput rates may be achieved at the data storage device 102.

FIG. 2 illustrates an embodiment of a memory module 200. The memory module 200 may be included in or may correspond to the data storage device 102 of FIG. 1.

The memory module 200 may include packaging 202 (e.g., a polymer encapsulant) at least partially enclosing one or more chip stacks. For example, the one or more chip stacks may include a first chip stack 210 and a second chip stack 220. The first chip stack 210, the second chip stack 220, or both, may function as described with reference to the first chip stack 140 of FIG. 1. The first chip stack 210 and the second chip stack 220 may be coupled to a substrate 230 (e.g., a silicon substrate). The substrate 230 may include electrical interconnect circuitry configured to enable data communications between the first chip stack 210 and the second chip stack 220. The substrate 230 may also include a plurality of electrical contacts 236 external to the packaging 202.

The first chip stack 210 may include a first die 212. For example, the first die 212 may include a memory die including a plurality of storage elements. The first chip stack 210 may also include a second die 216. For example, the second die 216 may include a first controller die. The first die 212 and the second die 216 may be coupled together via a first plurality of electrical contacts 214 between adjacent surfaces of the first die 212 and the second die 216 (e.g., using bump technology).

In a particular embodiment, the first chip stack 210 may be coupled to the substrate 230 via a second plurality of electrical contacts 218 between adjacent surfaces of the second die 216 and the substrate 230 (e.g., using bump technology). For example, the second die 216 may by coupled, at a first surface 232 of the substrate 230, to interconnect circuitry 238 of the substrate 230.

The second chip stack 220 may include a third die 222. For example, the third die 222 may be a second memory die including a second plurality of storage elements. The third die 222 may be coupled to a fourth die 226. The fourth die 226 may include a second controller die. The third die 222 and the fourth die 226 may be coupled together via a third plurality of electrical contacts 224 between adjacent surfaces of the third die 222 and the fourth die 226 (e.g., using bump technology).

In a particular embodiment, the second chip stack 220 may be coupled to the substrate 230 via a fourth plurality of electrical contacts 228 between adjacent surfaces of the fourth die 226 and the substrate 230 (e.g., using bump technology). For example, the fourth die 226 may by coupled, at the first surface 232 of the substrate 230, to interconnect circuitry 238 of the substrate 230, to through vias 240 of the substrate, or both.

The substrate 230 may have a second surface 234 that includes a fifth plurality of electrical contacts 236. The fifth plurality of electrical contacts 236 may be electrically coupled to the first chip stack 210, to the second chip stack 220, or to both. For example, the fifth plurality of electrical contacts 236 may be coupled to the second chip stack 220 by way of the through vias 240. Additionally, or in the alternative, the fifth plurality of the electrical contacts 236 may be coupled to the first chip stack 210 and/or to the fifth plurality of the electrical contacts 236 by way of the interconnect circuitry 238. The interconnect circuitry 238 may include conductive lines within layers of the substrate 230 and may include active and/or passive circuit components, such as for switching/routing data and/or for generating control signals (e.g., chip select or chip enable signals, as non-limiting examples).

During operation, data may be received by way of the fifth plurality of the electrical contacts 236. For example, the data may be received as signals from a host device, such as the host device 130 of FIG. 1. In response to receiving the data, one or more of the memory controller die, such as the second die 216 or the fourth die 226, may store a representation of the data at a corresponding memory die. For example, the data may include or be accompanied by addressing information indicating a storage address (e.g., a logical address) for the data. The storage address may correspond to a memory die of the first chip stack 210 or to a memory die of the second chip stack 220. In a particular embodiment as illustrated in FIG. 3, the memory module 200 may include additional control circuitry that is configured to identify a particular memory die or particular chip stack associated with the storage address.

For example, when the user data includes data to be stored at one or more storage elements of the first die 212, the data may be provided to the second die 216 via the interconnect circuitry 238. An ECC engine of the second die 216 may be configured to generate a codeword representing the data. The codeword has a particular number of bits based on an ECC process performed by the ECC engine. After generating the codeword, the second die 216 may write the codeword to a plurality of storage elements of the first die 212. For example, the second die 216 may apply signals to the plurality of the electrical contacts 214 to write the codeword to the plurality of the storage elements of the first die 212. In a particular embodiment, the number of electrical contacts 214 may be equal to or greater than the number of bits of the codeword. For example, when the second die 216 is configured to generate a 512 bit codeword, the plurality of electrical contacts 214 may include at least 512 electrical contacts. As another example, when the second die 216 is configured to generate a 1024 bit codeword, the plurality of electrical contacts 214 may include at least 1024 electrical contacts. Accordingly, the second die 216 may transmit the entire codeword to the first die 212 in parallel during a single clock cycle. That is, each bit of the codeword may be provided from the second die 216 to the first die 212 during a single clock cycle.

In another example, the memory module 200 may receive second data to be stored at one or more storage elements of the third die 222. The second data may be provided to the fourth die 226 by way of the through vias 240 or the interconnect circuitry 238. The fourth die 226 may include an ECC engine that is configured to generate a second codeword based on the second data. The second codeword may be provided from the fourth die 226 to the third die 222 for storage. For example, the fourth die 226 may apply signals to the plurality of the electrical contacts 224 to write the second codeword to a plurality of storage elements of the third die 222.

The second codeword may include a particular number of bits based on an ECC operation performed by the ECC engine of the fourth die 226. In a particular embodiment, the number of electrical contacts of the plurality of electrical contacts 224 may include at least as many electrical contacts as the number of bits of the second codeword. For example, when the fourth die 226 is configured to generate a 512 bit codeword, the plurality of electrical contacts 224 may include at least 512 electrical contacts. As another example, when the fourth die 226 is configured to generate a 1024 bit codeword, the plurality of electrical contacts 224 may include at least 1024 electrical contacts. In a particular embodiment, the codeword generated by the second die 216 may be a different size (e.g., may have a different number of bits) than the codeword generated by the fourth die 226. Accordingly, the plurality of electrical contacts 214 between the second die 216 and the first die 212 may have a different number of contacts than the plurality of electrical contacts 224 between the fourth die 226 and the third die 222.

Thus, one or more memory controller dies, such as the second die 216 and the fourth die 226, may generate a codeword based on data to be written to a corresponding memory die. Additionally, one or more of the controller dies may be coupled to a corresponding memory die via a plurality of electrical contacts that enables providing an entire codeword from the memory controller die to the memory die in a single clock cycle. By having multiple controllers sharing a common substrate, memory access operations may be performed concurrently (e.g., at least partially overlapping) to provide a host device with an enhanced effective data read throughput and/or write throughput via a single memory interface of the host device as compared to data storage devices that use a single controller.

FIG. 3 illustrates another embodiment of a memory module 300. The memory module 300 may be included in or may correspond to the data storage device 102 of FIG. 1.

The memory module 300 may include packaging 302 (e.g., a polymer encapsulant) at least partially enclosing one or more chip stacks. For example, the one or more chip stacks may include a first chip stack 310 and a second chip stack 330. The packaging 302 may also at least partially enclose one or more additional chips, such as eighth die 370 described further below. The first chip stack 310, the second chip stack 330, or both, may function as described with reference to the first chip stack 140 of FIG. 1, as described with reference to the first chip stack 210 of FIG. 2, or both. The first chip stack 310, the second chip stack 330, the one or more additional chips, or a combination thereof, may be coupled to a substrate 350 (e.g., a silicon substrate). The substrate 350 may include interconnect circuitry 358 configured to enable data communications between the first chip stack 310, the second chip stack 330, the one or more additional chips, or a combination thereof. The substrate 350 may also include a plurality of electrical contacts 356 external to the packaging 302 (e.g., at a second surface 354 of the substrate 350).

The first chip stack 310 and the second chip stack 330 may have a variety of different configurations. Specific examples of chip stack configurations are illustrated in FIG. 3; however, these are merely examples and are not limiting. For example, although FIG. 3 illustrates two chips stacks, in other embodiments, the memory module 300 may include more than two chip stacks or fewer than two chip stacks. As another example, the specific number of die and the ordering and arrangement of the die may be different in other embodiments. Additionally, in FIG. 3, the memory module 300 includes one additional chip, the eighth die 370; however, in other embodiments, the memory module 300 includes no additional chips (e.g., may include only chip stacks), and in still other embodiments, the memory module 300 includes more than one additional chip.

In a particular embodiment, the first chip stack 310 includes a first die 326. For example, the first die 326 may include a first controller memory die. The first die 326 may be coupled to a second die 320. The second die 320 may, for example, be a first memory die including a plurality of storage elements. The first die 326 and the second die 320 may be coupled together via a first plurality of electrical contacts 324 between adjacent surfaces of the first die 326 and the second die 320 (e.g., using bump technology).

The first chip stack 310 may also include additional die, such as a third die 316 and a fourth die 312. For example, the third die 316 may be a second memory die, a second memory controller die, or a memory support die (e.g., a die including support circuitry to facilitate reading data from or writing data to storage elements of a memory die, such as the read/write circuitry 180 or the latches 182 of FIG. 1). When the first chip stack 310 is configured such that the first die 326 is to communicate directly with the third die 316, the second die 320 may include a plurality of through vias 322 that enable communication between the first die 326 and the third die 316.

The fourth die 312 may be a memory die (e.g., a second memory die if the third die 316 is not a memory die or a third memory die if the third die 316 is a memory die). Alternately, the fourth die 312 may be a memory controller die or a memory support die. When the first chip stack 310 is configured such that the first die 326 or the second die 320 is to communicate directly with the fourth die 312, the third die 316 may include a plurality of through vias (not shown) that enable communication between the fourth die 312 and the first die 326, the second die 320, or both.

Each die of the first chip stack 310 may be coupled to an adjacent die using bump technology. To illustrate, the fourth die 312 may be coupled to the third die 316 via a plurality of electrical contacts 314 between adjacent surfaces of the fourth die 312 and the third die 316. Additionally, the third die 316 may be coupled to the second die 320 via a plurality of electrical contacts 318 between adjacent surfaces of the third die 316 and the second die 320. Further, as previously described, the second die 320 may be coupled to the first die 326 via the plurality of electrical contacts 324. The first chip stack 310 may also be coupled to the substrate 350 using bump technology. For example, the first die 326 may be coupled to a first side 352 of the substrate 350 via a plurality of electrical contacts 328 between adjacent surfaces of the first die 326 and the substrate 350. For example, the plurality of electrical contacts 328 may couple the first chip stack 310 to a first set of through vias 360 of the substrate 350, to the interconnect circuitry 358 of the substrate, or both. For example, the first chip stack 310 may be electrically connected (by way of the through vias 360 or the interconnect circuitry 358) to the second chip stack 330, to the one or more additional chips (e.g., to the eighth die 370), to the electrical contacts 356 that are external to the packaging 302, or to a combination thereof.

In a particular embodiment, the second chip stack 330 includes a fifth die 342. For example, the fifth die 342 may be a controller memory die. The fifth die 342 may be coupled to a sixth die 336. The sixth die 336 may be a memory die, a memory controller die, or a memory support die (e.g., a die including support circuitry to facilitate reading data from or writing data to storage elements of a memory die, such as the read/write circuitry 180 or the latches 182 of FIG. 1).

The second chip stack 330 may also include one or more additional die, such as a seventh die 332. For example, the seventh die 332 may be a memory die, a memory controller die, or a memory support die (e.g., a die including support circuitry to facilitate reading data from or writing data to storage elements of a memory die, such as the read/write circuitry 180 or the latches 182 of FIG. 1). When the second chip stack 330 is configured such that the fifth die 342 is to communicate directly with the seventh die 332, the sixth die 336 may include a plurality of through vias 338 that enable communication between the fifth die 342 and the seventh die 332.

Each die of the second chip stack 330 may be coupled to an adjacent die using bump technology. To illustrate, the seventh die 332 may be coupled to the sixth die 336 via a plurality of electrical contacts 334 between adjacent surfaces of the seventh die 332 and the sixth die 336. Additionally, the sixth die 336 may be coupled to the fifth die 342 via a plurality of electrical contacts 340 between adjacent surfaces of the sixth die 336 and the fifth die 342. The second chip stack 330 may also be coupled to the substrate 350 using bump technology. For example, the fifth die 342 may be coupled to the first side 352 of the substrate 350 via a plurality of electrical contacts 344 between adjacent surfaces of the fifth die 342 and the substrate 350. For example, the plurality of electrical contacts 344 may couple the second chip stack 330 to a second set of through vias 362 of the substrate 350, to the interconnect circuitry 358 of the substrate, or both. For example, the second chip stack 330 may be electrically connected (by way of the through vias 362 or the interconnect circuitry 358) to the first chip stack 310, to the one or more additional chips (e.g., to the eighth die 370), to the electrical contacts 356 that are external to the packaging 302, or to a combination thereof.

When the memory module 300 includes one or more additional die, such as the eighth die 370, the one or more additional die may include memory die, memory controller die, memory support die, or a combination thereof. The one or more additional die may be electrically connected to one or more chip stacks of the memory module 300. For example, in FIG. 3, the eighth die 370 is coupled to the interconnect circuitry 358 via a plurality of electrical contacts 372 between adjacent surfaces of the eighth die 370 and the substrate 350.

In a particular embodiment, the eighth die 370 may perform functions related to each of the chip stacks 310, 330. For example, the eighth die 370 may include a master controller that receives data and commands from a host device (such as the host device 130 of FIG. 1), determines a particular chip stack associated with the data and commands (e.g., based on a logical address provided by the host device), and provides the data and commands to a memory controller die of the particular chip stack. To illustrate, when data to be written to the fourth die 312 is received at the memory module 300, the eighth die 370 may determine that the fourth die 312 is in the first chip stack 310 and may provide the data to the first die 326. The first die 326 may generate a codeword based on the data and may provide the codeword to the fourth die 312 by way of through vias through the second die 320 and the third die 316 (e.g., the through vias 322). Alternately, if the third die 316 is a memory controller die associated with the fourth die 312, the first die 326 may send the data to the third die 316 by way of the through vias 322, in which case, the third die 316 may generate a codeword based on the data and provide the codeword to the fourth die 312.

In another example of the eighth die 370 performing functions related to the chip stacks 310, 330, the eighth die 370 may be a memory die. In this example, the eighth die 370 may act as a cache or buffer for data to be stored at a memory die of the chips stacks, or for data read from the memory die of the chip stacks. For example, the memory die of the chip stacks may include non-volatile memory and the eighth die 370 may include a higher speed volatile memory.

In yet another example of the eighth die 370 performing functions related to the chip stacks 310, 330, the eighth die 370 may be a memory support die. In this example, the eighth die 370 may perform functions such as load balancing, wear leveling, data shaping, power management or other functions that improve overall performance and/or longevity of the memory module 300.

During operation, data and commands may be communicated between the memory module 300 and a host device (such as the host device 130 of FIG. 1) by way of the plurality of the electrical contacts 356. In response to receiving the data, one or more of the memory controller die, such as the first die 326, the fifth die 342 or the eighth die 370, may store a representation of the data at a corresponding memory die. For example, the data may include or may be accompanied by addressing information indicating a storage address (e.g., a logical address) for the data. The storage address may correspond to a memory die of the first chip stack 310 or to a memory die of the second chip stack 330.

In a particular embodiment as illustrated in FIG. 3, the eighth die 370 may include circuitry that is configured to identify a particular memory die or a particular chip stack associated with the storage address. For example, the eighth die 370 may include a master controller that receives data and commands from a host device (such as the host device 130 of FIG. 1), determines a particular chip stack associated with the data and commands (e.g., based on the logical address), and provides the data and commands to a memory controller die of the particular chip stack. To illustrate, when data to be written to the fourth die 312 is received at the memory module 300, the eighth die 370 may determine that the fourth die 312 is in the first chip stack 310 and may provide the data to the first die 326. The first die 326 may generate a codeword based on the data and may provide the codeword to the fourth die 312 by way of through vias through the second die 320 and the third die 316 (e.g., the through vias 322). Alternately, if the third die 316 is a memory controller die associated with the fourth die 312, the first die 326 may send the data to the third die 316 by way of the through vias 322, in which case, the third die 316 may generate a codeword based on the data and provide the codeword to the fourth die 312.

One or more memory controller die of the memory module 300 may include an ECC engine. For example, the first die 326 may include a first ECC engine that is configured to generate a first codeword representing data that is to be stored at a memory die of the first chip stack 310. Additionally, the fifth die 342 may include a second ECC engine that is configured to generate a second codeword representing data that is to be stored at a memory die of the second chip stack 330. Each codeword has a particular number of bits based on an ECC process performed by the corresponding ECC engine. For example, the first codeword may include a first number of bits, and the second codeword may include a second number of bits. The first number of bits may be the same as the second number of bits, or the first number of bits may be different than the second number of bits. Electrical contacts between each memory controller die and its associated memory die or dies may form a bus (or a portion of a bus) that enables communication of every bit of a codeword from the memory controller die to the associated memory die.

For example, the first die 326 may be configured to generate a 512 bit codeword. In this example, the electrical contacts 324 between the first die 326 and the second die 320 may include at least 512 electrical contacts, which enable all 512 bits of a codeword generated by the first die 326 to be sent to the second die 320 in parallel (e.g., during a single clock cycle of a processor of the memory module 300 or of the host device). As another example, the first die 326 may be configured to generate a 1024 bit codeword. In this example, the electrical contacts 324 between the first die 326 and the second die 320 may include at least 1024 electrical contacts, which enable all 1024 bits of a codeword generated by the first die 326 to be sent to the second die 320 in parallel.

As yet another example, the fifth die 342 may be configured to generate a 512 bit codeword to be stored at the seventh die 332. In this example, the through vias 338 through the sixth die 336 may include at least 512 through vias, and the electrical contacts 334 between the sixth die 336 and the seventh die 332 may include at least 512 electrical contacts. In this example, the electrical contacts 340 between the fifth die 342 and the sixth die 336 may enable all 512 bits of a codeword generated by the fifth die 342 to be sent, in parallel, to either the sixth die 336 or the seventh die 332.

Thus, one or more memory controller dies, such as the first die 326 or the fifth die 342, may generate a codeword based on data to be written to a corresponding memory die. Additionally, one or more of the controller die may be coupled to a corresponding memory die via a plurality of electrical contacts that enables providing an entire codeword from the memory controller die to the memory die in a single clock cycle.

Figure 4:
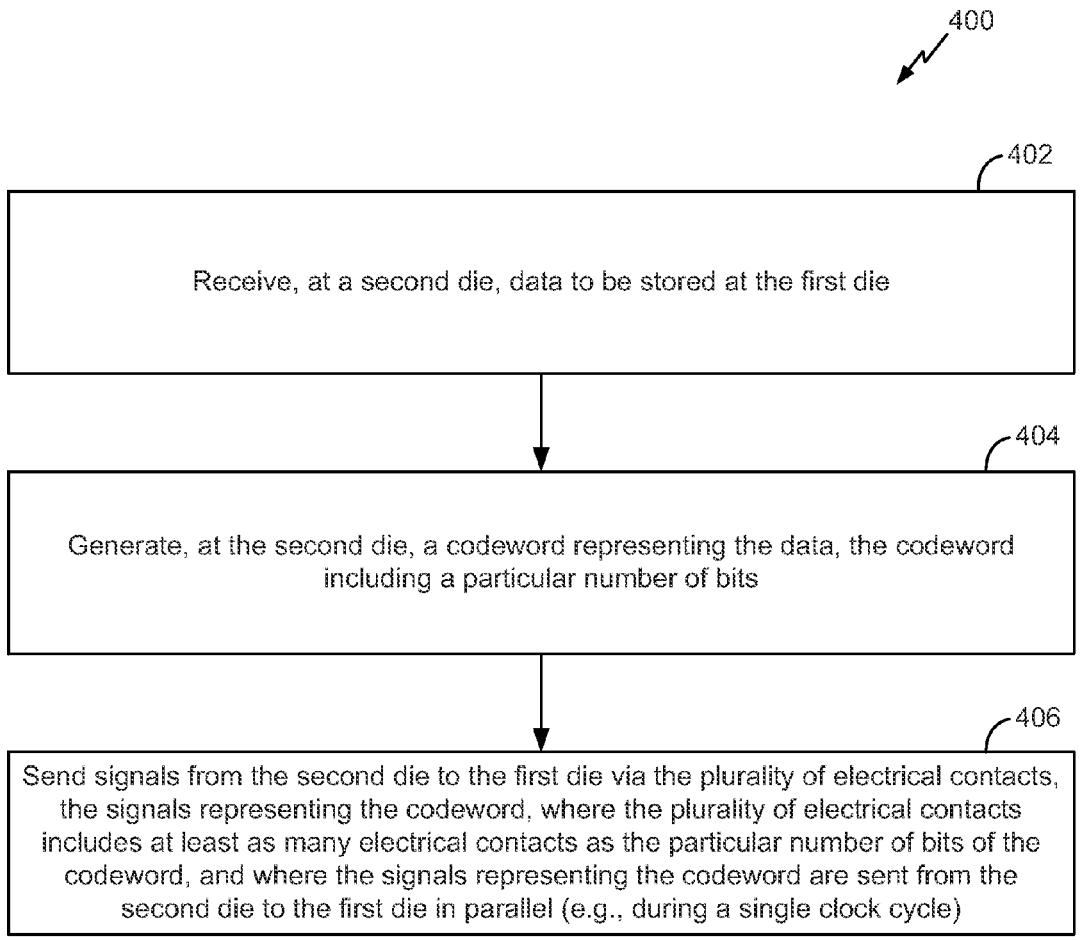
FIG. 4 is a flow diagram of an illustrative embodiment of a method to communicate data between a controller and a memory.

Referring to FIG. 4, an illustrative embodiment of a method 400 to communicate bits of a codeword in parallel between a controller and a memory is shown. For example, the method 400 may be performed by a controller of a data storage device, such as by the controller 120 of the data storage device 102 of FIG. 1 or one or more of the memory controller dies of FIGS. 2 and 3.

The method 400 includes, at 402, receiving, at a first controller die, first data to be stored at a first memory die. For example, the first data may be received by the controller 120 of FIG. 1. As other examples, the first data may be received by the second die 216 or the fourth die 226 of FIG. 2, or by the fifth die 342 or the first die 326 of FIG. 3.

The method 400 includes, at 404, generating, at the first controller die, a first codeword representing the first data. The first codeword including a first number of bits, for example, based on an ECC operation performed to generate the first codeword. For example, the controller 120 may perform an ECC operation on the first data to generate the codeword 128, which includes N-bits.

The method 400 includes, at 406, sending signals from the first controller die to the first memory die via the first plurality of electrical contacts. The first plurality of electrical contacts includes at least as many electrical contacts as the first number of bits of the first codeword, and the signals representing the first codeword are sent from the first controller die to the first memory die in parallel. For example, the controller 120 may be coupled to the memory 104 by the bus 156 which includes at least N electrical contacts 150 and N electrical contacts 154. Thus, all N bits of the codeword 128 may be communicated in parallel from the controller 120 to the memory 104 (e.g., during a write operation) or from the memory 104 to the controller 120 (e.g., during a read operation).

Thus, the method 400 enables communicating an entire codeword (e.g., from a memory controller die to a memory die, or from a memory die to a memory controller die) in a single clock cycle.

Figure 5:
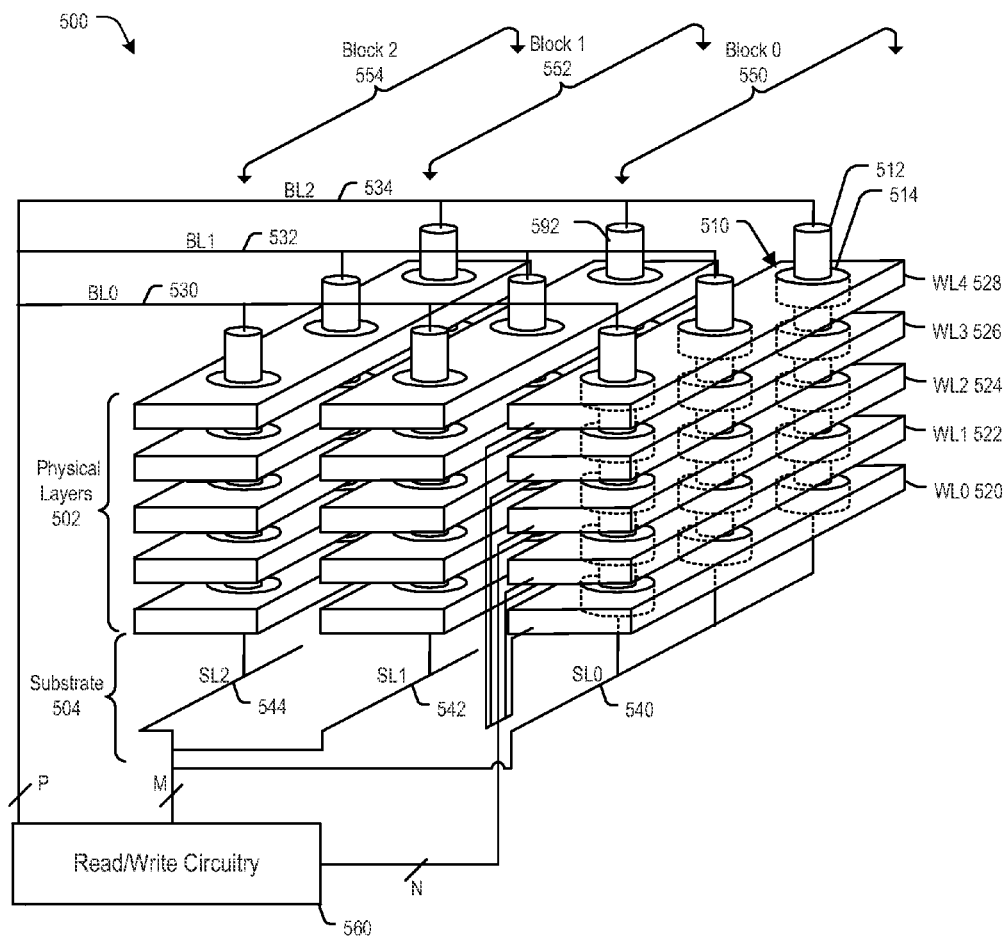
FIG. 5 is a block diagram of a particular embodiment of the non-volatile memory for use in the data storage device of FIG. 1, in the memory module of FIG. 2, or in the memory module of FIG. 3.

FIG. 5 illustrates an embodiment of a 3D memory 500 in a NAND flash configuration. The 3D memory 500 may correspond to the memory 104 of FIG. 1, or to one of more of the memory dies of FIGS. 2 and 3. The 3D memory 500 includes multiple physical layers 502 that are monolithically formed above a substrate 504, such as a silicon substrate. The multiple physical layers may include or correspond to a first group of physical layers that include the first group 106 of storage elements. Storage elements (e.g., memory cells), such as a representative memory cell 510, are arranged in arrays in the physical layers.

The memory cell 510 includes a charge trap structure 514 between a wordline/control gate (WL4) 528 and a conductive channel 512. Charge may be injected into or drained from the charge trap structure 514 by biasing the conductive channel 512 relative to the wordline 528. For example, the charge trap structure 514 may include silicon nitride and may be separated from the wordline 528 and the conductive channel 512 by a gate dielectric, such as silicon oxide. An amount of charge in the charge trap structure 514 affects an amount of current through the conductive channel 512 during a read operation of the memory cell 510 and indicates one or more bit values that are stored in the memory cell 510.

The 3D memory 500 includes multiple blocks, including a first block (block 0) 550, a second block (block 1) 552, and a third block (block 2) 554. Each block 550-554 includes a "vertical slice" of the physical layers 502 that includes a stack of wordlines, illustrated as a first wordline (WL0) 520, a second wordline (WL1) 522, a third wordline (WL2) 524, a fourth wordline (WL3) 526, and the fifth wordline (WL4) 528. Multiple conductive channels (having a substantially vertical orientation with respect to FIG. 5) extend through the stack of wordlines. Each conductive channel is coupled to a storage element in each wordline 520-528, forming a NAND string of storage elements. FIG. 5 illustrates three blocks 550-554, five wordlines 520-528 in each block, and three conductive channels in each block for clarity of illustration. However, the 3D memory 500 may have more than three blocks, more than five wordlines per block, and more than three conductive channels per block.

Read/write circuitry 560 is coupled to the conductive channels via multiple conductive lines, illustrated as a first bit line (BL0) 530, a second bit line (BL1) 532, and a third bit line (BL2) 534 at a "top" end of the conducive channels (e.g., farther from the substrate 504) and a first source line (SL0) 540, a second source line (SL1) 542, and a third source line (SL2) 544 at a "bottom" end of the conductive channels (e.g., nearer to or within the substrate 504). The read/write circuitry 560 is illustrated as coupled to the bit lines 530-534 via "P" control lines, coupled to the source lines 540-544 via "M" control lines, and coupled to the wordlines 520-528 via "N" control lines. Each of P, M, and N may have a positive integer value based on the specific configuration of the 3D memory 500. In the illustrative example of FIG. 5, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 592 and a particular source line may be coupled to the top of the conductive channel 512. The bottom of the conductive channel 592 may be coupled (e.g., electrically coupled) to the bottom of the conductive channel 512. Accordingly, the conductive channel 592 and the conductive channel 512 may be coupled in series and may be coupled to the particular bit line and the particular source line.

The read/write circuitry 560 may operate as described with respect to the read/write circuitry 180 of FIG. 1. For example, data may be stored to storage elements coupled to the wordline 528 and the read/write circuitry 560 may read bit values from the storage elements. As another example, the read/write circuitry 560 may apply selection signals to control lines coupled to the wordlines 520-528, the bit lines 530-534, and the source lines 540-542 to cause a programming voltage (e.g., a voltage pulse or series of voltage pulses) to be applied across selected storage element(s) of the selected wordline (e.g., the fourth wordline 528).

During a read operation, the controller 120 may receive a request from a host device, such as the host device 130 of FIG. 1. The controller 120 may cause the read/write circuitry 560 to read bits from particular storage elements of the 3D memory 500 by applying appropriate signals to the control lines to cause storage elements of a selected wordline to be sensed. Accordingly, the 3D memory 500 may be configured to read from and write data to one or more storage elements. As described above, the signals may be applied in parallel to a bus that includes at least as many electrical contacts as a number of bits of a codeword used to represent the data. In addition, the 3D memory 500 may be included in a memory die of a multi-die stack that is coupled, via interconnection circuitry of a common substrate, to one or more other multi-die stacks that may also include 3D memory, such as described with reference to FIGS. 1-3.

Figure 6:
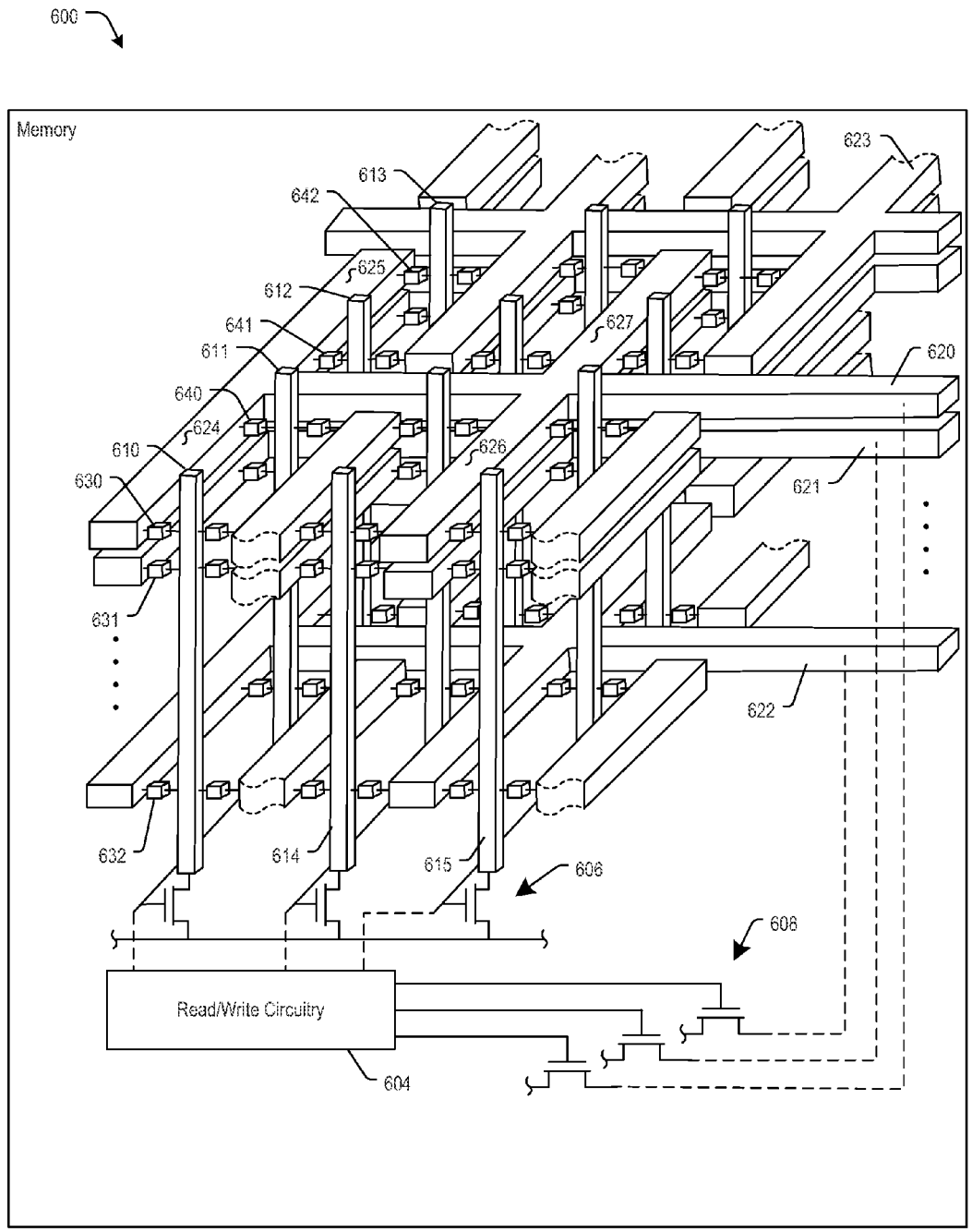
FIG. 6 is a block diagram of another particular embodiment of the non-volatile memory for use in the data storage device of FIG. 1, in the memory module of FIG. 2, or in the memory module of FIG. 3.

FIG. 6 is a diagram of a particular embodiment of a memory 600. The memory 600 may be included in the data storage device 102 of FIG. 1, or to one or more of the memory dies of FIGS. 2 and 3. In addition, the memory 600 may be included in a memory die of a multi-die stack that is coupled, via interconnection circuitry of a common substrate, to one or more other multi-die stacks that may also include 3D memory, such as described with reference to FIGS. 1-3. FIG. 6 illustrates a portion of a three-dimensional architecture of the memory 600, such as the memory 104. In the embodiment illustrated in FIG. 6, the memory is a vertical bit line Resistive Random Access Memory (ReRAM) with a plurality of conductive lines in physical layers over a substrate (e.g., substantially parallel to a surface of the substrate), such as representative wordlines 620, 621, 622, and 623 (only a portion of which is shown in FIG. 6) and a plurality of vertical conductive lines through the physical layers, such as representative bit lines 610, 611, 612, and 613. The wordline 622 may include or correspond to a first group of physical layers and the wordlines 620, 621 may include or correspond to a second group of physical layers.

The memory 600 also includes a plurality of resistance-based storage elements (e.g., memory cells), such as representative storage elements 630, 631, 632, 640, 641, and 642, each of which is coupled to a bit line and a wordline in arrays of memory cells in multiple physical layers over the substrate (e.g., a silicon substrate). The memory 600 also includes read/write circuitry 604, such as the read/write circuitry 180 of FIG. 1. The read/write circuitry 604 is coupled to wordline drivers 608 and bit line drivers 606.

In the embodiment illustrated in FIG. 6, each of the wordlines includes a plurality of fingers (e.g., a first wordline 620 includes fingers 624, 625, 626, and 627). Each finger may be coupled to more than one bit line. To illustrate, a first finger 624 of the first wordline 620 is coupled to a first bit line 610 via a first storage element 630 at a first end of the first finger 624 and is coupled to a second bit line 611 via a second storage element 640 at a second end of the first finger 624.

In the embodiment illustrated in FIG. 6, each bit line may be coupled to more than one wordline. To illustrate, the first bit line 610 is coupled to the first wordline 620 via the first storage element 630 and is coupled to a third wordline 622 via a third storage element 632.

During a write operation, the controller 120 may receive data from a host device, such as the host device 130 of FIG. 1. The controller 120 may send the data (or a representation of the data, such as a codeword) to the memory 600. For example, the controller 120 may encode the data prior to sending the encoded data to the memory 600. As described above, the controller may send the data by applying signals to a bus. The bus includes at least as many electrical contacts as a number of bits of a codeword used to represent the data, such that the bits of the codeword can be sent in parallel.

The read/write circuitry 604 may write the data to storage elements corresponding to the destination of the data. For example, the read/write circuitry 604 may apply selection signals to selection control lines coupled to the wordline drivers 608 and the bit line drivers 606 to cause a write voltage to be applied across a selected storage element. For example, to select the first storage element 630, the read/write circuitry 604 may activate the wordline drivers 608 and the bit line drivers 606 to drive a programming current (also referred to as a write current) through the first storage element 630. To illustrate, a first write current may be used to write a first logical value (e.g., a value corresponding to a high-resistance state) to the first storage element 630, and a second write current may be used to write a second logical value (e.g., a value corresponding to a low-resistance state) to the first storage element 630. The programming current may be applied by generating a programming voltage across the first storage element 630 by applying a first voltage to the first bit line 610 and to wordlines other than the first wordline 620 and applying a second voltage to the first wordline 620. In a particular embodiment, the first voltage is applied to other bit lines (e.g., the bit lines 614, 615) to reduce leakage current in the memory 600.

During a read operation, the controller 120 may receive a request from a host device, such as the host device 130 of FIG. 1. The controller 120 may cause the read/write circuitry 604 to read bits from particular storage elements of the memory 600 by applying selection signals to selection control lines coupled to the wordline drivers 608 and the bit line drivers 606 to cause a read voltage to be applied across a selected storage element. For example, to select the first storage element 630, the read/write circuitry 604 may activate the wordline drivers 608 and the bit line drivers 606 to apply a first voltage (e.g., 0.7 volts (V)) to the first bit line 610 and to wordlines other than the first wordline 620. A lower voltage (e.g., 0 V) may be applied to the first wordline 620. Thus, a read voltage is applied across the first storage element 630, and a read current corresponding to the read voltage may be detected at a sense amplifier of the read/write circuitry 604. The read current corresponds (via Ohm's law) to a resistance state of the first storage element 630, which corresponds to a logical value stored at the first storage element 630. The logical value read from the first storage element 630 and other elements read during the read operation may be provided to the controller 120.

Although various components depicted herein are illustrated as block components and described in general terms, such components may include one or more microprocessors, state machines, or other circuits configured to enable the data storage device 102 to perform one or more operations described herein. For example, the controller 120 of FIG. 1 and/or the memory (e.g., the read/write circuitry 180) may represent physical components, such as hardware controllers, state machines, logic circuits, or other structures, to enable reading data from and writing data to the memory 104. In addition, the controller 120 and/or the memory may include physical components to enable routing of data and commands in a multi-stack arrangement on a common substrate using interconnection circuitry of the substrate, such as chip enable and select logic circuitry, bus mastering and/or arbitration circuitry, etc.

Alternatively, or in addition, one or more components of the data storage device 102 may be implemented using a microprocessor or microcontroller programmed to perform one or more operations described herein. To illustrate, operations corresponding to the controller 120, the read/write circuitry 180, or other components, may be implemented using a processor that executes instructions, as illustrative examples. For example, the controller 120 may execute instructions to enable routing of data and commands in a multi-stack arrangement on a common substrate using interconnection circuitry of the substrate, such as chip enable and select logic, bus mastering and/or arbitration operations, etc. In a particular embodiment, the instructions are stored at the memory 104. Alternatively, or in addition, executable instructions that are executed by the processor may be stored at a separate memory location that is not part of the memory 104, such as at a read-only memory (ROM).

Semiconductor memory devices, such as the memory 104, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., in a NOR memory array. NAND and NOR memory configurations described have been presented as examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor material, such as silicon.

The memory elements may be arranged in the single memory device level in an ordered array, such as in a plurality of rows and/or columns. However, the memory elements may be arranged in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration (e.g., in an x-z plane), resulting in a three dimensional arrangement of memory elements with elements arranged on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. To illustrate, each of the memory device levels may have a corresponding substrate thinned or removed before stacking the memory device levels to form memory arrays. Because each of the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

In some implementations, the memory 104 is a non-volatile memory having a three-dimensional (3D) memory configuration that is monolithically formed in one or more physical levels of arrays of memory cells having an active area disposed above a silicon substrate. The active area of a memory cell may be an area of the memory cell that is conductively throttled by a charge trap portion of the memory cell. The data storage device 102 and/or the host device 130 may include circuitry, such as read/write circuitry, as an illustrative, non-limiting example, associated with operation of the memory cells.

Associated circuitry is typically used for operation of the memory elements and for communication with the memory elements. As non-limiting examples, memory devices may have circuitry for controlling and driving memory elements to perform functions such as programming and reading. The associated circuitry may be on the same substrate as the memory elements and/or on a separate substrate. For example, a controller for memory read-write operations may be located on a separate controller chip and/or on the same substrate as the memory elements One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
a first chip stack including:
a first memory die comprising a first plurality of storage elements arranged in a three-dimensional (3D) memory configuration; and
a first controller die coupled to the first memory die via a first bus formed of a first plurality of electrical contacts between adjacent surfaces of the first memory die and the first controller die;
a second chip stack including:
a second memory die comprising a second plurality of storage elements arranged in a 3D memory configuration; and
a second controller die coupled to the second memory die via a second bus formed of a second plurality of electrical contacts between adjacent surfaces of the second memory die and the second controller die; and
a substrate having a first surface, wherein the first chip stack and the second chip stack are coupled to the substrate at the first surface, the substrate including:
a second surface opposite the first surface; and
a third plurality of electrical contacts at the second surface, wherein the third plurality of electrical contacts is electrically coupled to the first chip stack, the second chip stack, or both.

2. The data storage device of claim 1, wherein the substrate is a silicon substrate and further includes interconnect circuitry configured to enable data communications between the first chip stack and the second chip stack.

3. The data storage device of claim 1, wherein the first controller die is configured to receive first data to be stored at the first memory die, to generate a first codeword representing the first data, the first codeword having a first number of bits, and to write the first codeword to the first plurality of storage elements, and wherein the first plurality of electrical contacts includes at least as many contacts as the first number of bits of the first codeword.

4. The data storage device of claim 3, wherein the second controller die is configured to receive second data to be stored at the second memory die, to generate a second codeword representing the second data, the second codeword having a second number of bits, and to write the second codeword to the second plurality of storage elements, and wherein the second plurality of electrical contacts includes at least as many contacts as the second number of bits of the second codeword.

5. The data storage device of claim 4, wherein the first number of bits is different than the second number of bits.

6. The data storage device of claim 1, wherein the first plurality of storage elements are non-volatile storage elements and the second plurality of storage elements are volatile storage elements.

7. The data storage device of claim 1, wherein the first chip stack further includes a third memory die, the third memory die including a third plurality of storage elements arranged in a three-dimensional (3D) memory configuration.

8. The data storage device of claim 7, wherein the first memory die includes a plurality of through vias, and wherein the first controller die is coupled to the third memory die by way of the plurality of through vias, wherein the third memory die is coupled to the plurality of through vias by a fourth plurality of electrical contacts between adjacent surfaces of the third memory die and the first memory die.

9. The data storage device of claim 7, wherein the first chip stack further includes a third controller die, and wherein the third memory die is coupled to the third controller die by a fourth plurality of electrical contacts between adjacent surfaces of the third memory die and the third controller die.

10. The data storage device of claim 9, wherein the first controller die is configured to control the first memory die and the third controller die is configured to control the third memory die.

11. The data storage device of claim 1, wherein the first chip stack further comprises a third die including memory support circuitry corresponding to read circuitry, write circuitry, additional memory control circuitry, or a combination thereof, wherein the third die is coupled to the first bus by a fourth plurality of electrical contacts between a surface of the third die and an adjacent surface of the first controller die or between the surface of the third die and an adjacent surface of the first memory die.

12. The data storage device of claim 1, further comprising a fourth die coupled to the first chip stack via interconnect circuitry of the substrate.

13. The data storage device of claim 12, wherein the fourth die includes a fourth plurality of storage elements.

14. The data storage device of claim 13, wherein the first controller die is configured to control the fourth plurality of storage elements.

15. A method comprising:
  at a data storage device comprising a first memory die including a plurality of storage elements arranged in a three dimensional (3D) memory configuration and a first controller die coupled to the first memory die via a first bus including a first plurality of electrical contacts between adjacent surfaces of the first memory die and the first controller die, performing:
    receiving, at the first controller die, first data to be stored at the first memory die;
    generating, at the first controller die, a first codeword representing the first data, the first codeword including a first number of bits; and
    sending signals from the first controller die to the first memory die via the first plurality of electrical contacts, wherein the first plurality of electrical contacts includes at least as many electrical contacts as the first number of bits of the first codeword, and wherein the signals representing the first codeword are sent from the first controller die to the first memory die in parallel.

16. The method of claim 15, wherein the first memory die and the first controller die form a chip stack coupled to a first surface of a silicon substrate, wherein the silicon substrate includes a second plurality of electrical contacts at a second surface of the silicon substrate that is opposite the first surface, wherein the first data is received from a host device coupled to the second plurality of electrical contacts, and wherein the signals representing the first codeword are sent during a single clock cycle of a clock of the data storage device or of a clock of a processor of the host device.

17. The method of claim 15, wherein the data storage device further includes a second memory die comprising a second plurality of storage elements arranged in a 3D memory configuration and a second controller die coupled to the second memory die via a second bus formed of a third plurality of electrical contacts between adjacent surfaces of the second memory die and the second controller die.

18. The method of claim 17, further comprising:
  receiving, at the second controller die, second data to be stored at the second memory die;
  generating, at the second controller die, a second codeword representing the second data, the second codeword including a second number of bits; and
  sending signals from the second controller die to the second memory die via the third plurality of electrical contacts, wherein the third plurality of electrical contacts includes at least as many electrical contacts as the second number of bits of the second codeword, and wherein the signals representing the second codeword are sent from the second controller die to the second memory die in parallel.

19. The method of claim 17, wherein the first number of bits is different than the second number of bits.

20. The method of claim 17, wherein the first memory die, the first controller die, the second memory die, and the second controller die form a first chip stack coupled to a silicon substrate, wherein the data storage device includes a second chip stack coupled to the silicon substrate, wherein interconnect circuitry of the silicon substrate is coupled to the first chip stack and to the second chip stack.

* * * * *